(12) United States Patent
Lin

(10) Patent No.: US 7,555,698 B2
(45) Date of Patent: Jun. 30, 2009

(54) METHOD AND APPARATUS FOR EXTRACTING SPECIFIC DATA FROM BIS DATA

(75) Inventor: Li-Lien Lin, Hsin-Chu (TW)

(73) Assignee: MediaTek Inc., Hsin-Chu, Hsien (TW)

( * ) Notice: Subject to any disclaimer, the term of this patent is extended or adjusted under 35 U.S.C. 154(b) by 385 days.

(21) Appl. No.: 11/421,768

(22) Filed: Jun. 2, 2006

(65) Prior Publication Data

US 2007/0011597 A1    Jan. 11, 2007

(30) Foreign Application Priority Data

Jun. 14, 2005    (TW) ............................... 94119649 A

(51) Int. Cl.
*H03M 13/00* (2006.01)
*G06F 13/00* (2006.01)
(52) U.S. Cl. ................. 714/762; 714/800; 714/758; 714/775; 711/154
(58) Field of Classification Search ............ 714/762, 714/758, 775, 800; 711/154
See application file for complete search history.

(56) References Cited

U.S. PATENT DOCUMENTS 7,370,262 B2 *   5/2008   Hwang et al. ............... 714/775
2004/0120240 A1   6/2004   Lee
2004/0125732 A1   7/2004   Cheng
2008/0181073 A1 *  7/2008   Hwang et al. ............ 369/53.17

FOREIGN PATENT DOCUMENTS

| KR | 10-2004-0009454 | 1/2004 |
| TW | 200405302 | 4/2004 |
| TW | 200502921 | 1/2005 |
| TW | I227481 | 2/2005 |
| TW | I233109 | 5/2005 |
| WO | 98/21840 | 5/1998 |
| WO | 2004/021337 | 3/2004 |

* cited by examiner

*Primary Examiner*—Hyung S Sough
*Assistant Examiner*—Mardochee Chery
(74) *Attorney, Agent, or Firm*—Winston Hsu

(57) ABSTRACT

Methods and apparatus for extracting a portion of data from a plurality of BIS data are disclosed. The portion of data can be extracted from the plurality of BIS data stored in a first storage unit when those BIS data are accessed by other components. Alternatively, the extraction of the portion of data can be performed when the plurality of BIS data is written into the first storage unit. The extracted data are stored in a second storage unit to improve the accessing efficiency thereof.

48 Claims, 7 Drawing Sheets

| Byte number \ Bit number | Bit 7 | Bit 6 | Bit 5 | Bit 4 | Bit 3 | Bit 2 | Bit 1 | Bit 0 |
|---|---|---|---|---|---|---|---|---|
| AF_4,0  | Sa_0,1  | Sa_1,1  | Sa_0,0  | Sa_1,1  | IdT_7 | Rd_15 | a_31 | a_30 |
| AF_4,1  | Sa_2,1  | Sa_3,1  | Sa_2,0  | Sa_3,1  | IdT_6 | Rd_14 | a_29 | a_28 |
| AF_4,2  | Sa_4,1  | Sa_5,1  | Sa_4,0  | Sa_5,1  | IdT_5 | Rd_13 | a_27 | a_26 |
| AF_4,3  | Sa_6,1  | Sa_7,1  | Sa_6,0  | Sa_7,1  | IdT_4 | Rd_12 | a_25 | a_24 |
| AF_4,4  | Sa_8,1  | Sa_9,1  | Sa_8,0  | Sa_9,1  | IdT_3 | Rd_11 | a_23 | a_22 |
| AF_4,5  | Sa_10,1 | Sa_11,1 | Sa_10,0 | Sa_11,1 | IdT_2 | Rd_10 | a_21 | a_20 |
| AF_4,6  | Sa_12,1 | Sa_13,1 | Sa_12,0 | Sa_13,1 | IdT_1 | Rd_9  | a_19 | a_18 |
| AF_4,7  | Sa_14,1 | Sa_15,1 | Sa_14,0 | Sa_15,1 | IdT_0 | Rd_8  | a_17 | a_16 |
| AF_4,8  | Sa_16,1 | Sa_17,1 | Sa_16,0 | Sa_17,1 | —     | Rd_7  | a_15 | a_14 |
| AF_4,9  | Sa_18,1 | Sa_19,1 | Sa_18,0 | Sa_19,1 | —     | Rd_6  | a_13 | a_12 |
| AF_4,10 | Sa_20,1 | Sa_21,1 | Sa_20,0 | Sa_21,1 | —     | Rd_5  | a_11 | a_10 |
| AF_4,11 | Sa_22,1 | Sa_23,1 | Sa_22,0 | Sa_23,1 | —     | Rd_4  | a_9  | a_8  |
| AF_4,12 | Sa_24,1 | Sa_25,1 | Sa_24,0 | Sa_25,1 | —     | Rd_3  | a_7  | a_6  |
| AF_4,13 | Sa_26,1 | Sa_27,1 | Sa_26,0 | Sa_27,1 | —     | Rd_2  | a_5  | a_4  |
| AF_4,14 | Sa_28,1 | Sa_29,1 | Sa_28,0 | Sa_29,1 | —     | Rd_1  | a_3  | a_2  |
| AF_4,15 | Sa_30,1 | Sa_31,1 | Sa_30,0 | Sa_31,0 | —     | Rd_0  | a_1  | a_0  |

Fig. 2 Related art

METHOD AND APPARATUS FOR EXTRACTING SPECIFIC DATA FROM BIS DATA

BACKGROUND

The present invention relates to optical storage techniques, and more particularly, to methods and apparatuses for extracting specific bits or bytes from BIS data.

According to the specification of the blu-ray disc, a cluster read from an optical disc comprises a BIS (burst indicator subcode) cluster and an LDC (long distance code) cluster. The cluster comprises sixteen address units. The address information of these address units is recorded in the BIS cluster. In decoding, the BIS cluster of 3 columns by 496 rows must be converted into a BIS block of 24 columns by 62 rows. This conversion is necessary in the effort to correct errors of the BIS data.

FIG. 1 shows a schematic diagram of a typical BIS block 100. The BIS block 100 contains 30 rows of data (including 6 rows of physical address information and 24 rows of user control data) and 32 rows of parity information. Each column of the BIS block 100 is a BIS codeword, which contains 6 bytes of physical address information, 24 bytes of user control data, and 32 bytes of parity information. In other words, the BIS block 100 has 24 BIS codewords denoted as BIS codeword 0 through BIS codeword 23 starting from the left and working to the right. During the decoding operations, errors of a BIS codeword may be corrected based on the parity bytes of the BIS codeword.

The 6 rows of physical address information of the BIS block 100 are utilized for recording the sixteen address fields (AFs) of sixteen physical sectors of a physical cluster. Each address field consists of nine bytes of data, wherein the first four bytes are an address unit number (AUN) of a corresponding physical sector, the fifth byte is a flag byte that is utilized for recording flag bits, and the last four bytes are parities of the address field. In FIG. 1, each byte of the sixteen address fields is denoted as AF_n,m where m is the number of the address field and n is the byte number of the address field. For example, AF_4,1 indicates the byte four of the address field one.

As is well known in the art, the nine bytes of an address field are not recorded in contiguous positions of the BIS block 100. Instead, the nine bytes are interleaved into different BIS codewords. For example, the nine bytes of the first address field (i.e., the address field zero), AF_0,0, AF_1,0 through AF_8,0, are respectively byte 0 of the BIS codeword 0, byte 0 of the BIS codeword 1, byte 0 of the BIS codeword 2, byte 2 of the BIS codeword 5, byte 2 of the BIS codeword 3, byte 2 of the BIS codeword 4, byte 4 of the BIS codeword 7, byte 4 of the BIS codeword 8, and byte 4 of the BIS codeword 6. As shown in FIG. 1, since the first four bytes for recording the AUN of the address field zero are not located in contiguous positions, the efficiency of reading the AUN of the address field zero by the conventional optical storage device is reduced accordingly. In fact, the same problem is encountered during the process of reading other address unit numbers.

As mentioned previously, there are sixteen address fields in the BIS block 100 and the flag byte (i.e., the fifth byte) of each address field recorded with important flag bits. FIG. 2 is a flag bit list 200 of a typical BIS data. As shown in the flag bit list 200, for each of the sixteen flag bytes, the bit 7 and bit 5 are status bits of an even data frame of the physical cluster; bit 6 and bit 4 are status bits of an odd data frame; bit 2 is recording date bit; and bit 1 and bit 0 are address bits for recording the address of the last recorded data. In addition, bit 3 of the eight address fields AF_4,0, AF_4,1, through AF_4,7 is a recorder ID tag number IdT_I.

Similar to the aforementioned address fields, the sixteen flag bytes are interleaved into different BIS codewords instead of being stored in contiguous positions of the BIS block 100. Therefore, the efficiency of reading the flag bits recorded in the flag bytes by the conventional optical storage device is undesirable as its performance is limited by the BIS data arrangement. The reading efficiency of the address fields or flag bits significantly affects the accessing speed of the blu-ray disc. There is, therefore, a need for methods and apparatus to improve the accessing efficiency of the address fields or the flag bits mentioned previously, or both.

SUMMARY OF THE INVENTION

An exemplary embodiment of a data extracting device is disclosed comprising: a first storage unit for storing a plurality of burst indicator subcode (BIS) data; a data extracting module coupled to the first storage unit for extracting and outputting a portion of data of the plurality of BIS data when the plurality of BIS data is accessed; and a second storage unit coupled to the data extracting module for storing the portion of data transmitted from the data extracting module.

An exemplary embodiment of a data extracting method is disclosed comprising: storing a plurality of burst indicator subcode (BIS) data in a first storage unit; extracting a portion of data of the plurality of BIS data when the plurality of BIS data stored in the first storage unit is accessed; and storing the portion of data in a second storage unit.

Another exemplary embodiment of a data extracting device is disclosed comprising: a data extracting module for extracting and outputting a portion of data of a plurality of BIS data while the plurality of BIS data is written into a first storage unit; and a second storage unit coupled to the data extracting module for storing the portion of data transmitted from the data extracting module.

Thereto, another exemplary embodiment of a data extracting method is disclosed comprising: extracting a portion of data of a plurality of BIS data while the plurality of BIS data is written into a first storage unit; and storing the portion of data in a second storage unit.

BRIEF DESCRIPTION OF THE DRAWINGS

FIG. 2 is a flag bit list of a typical BIS data.

DETAILED DESCRIPTION

Figure 1:
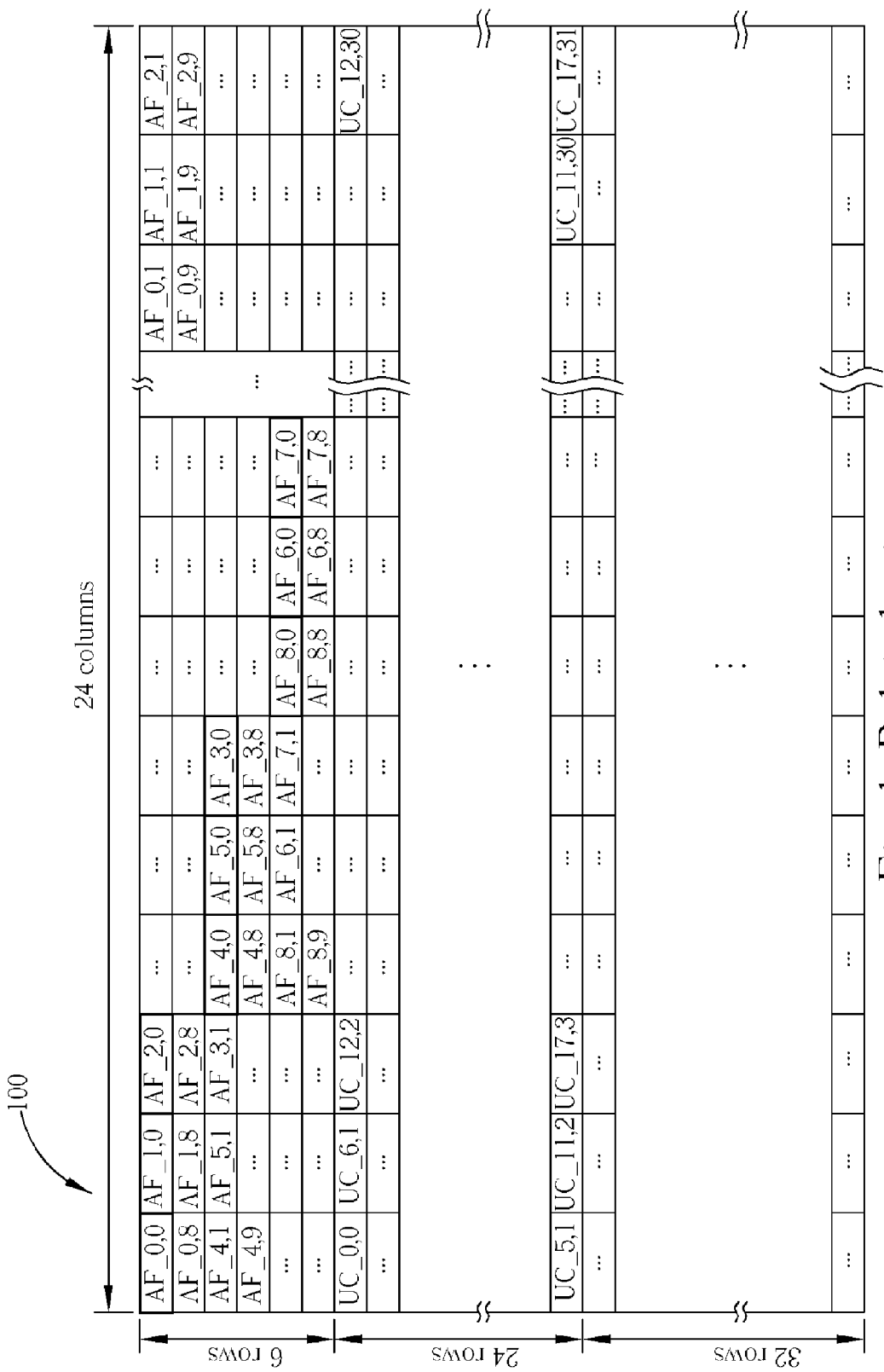
FIG. 1 is a schematic diagram of a typical BIS block.
Figure 3:
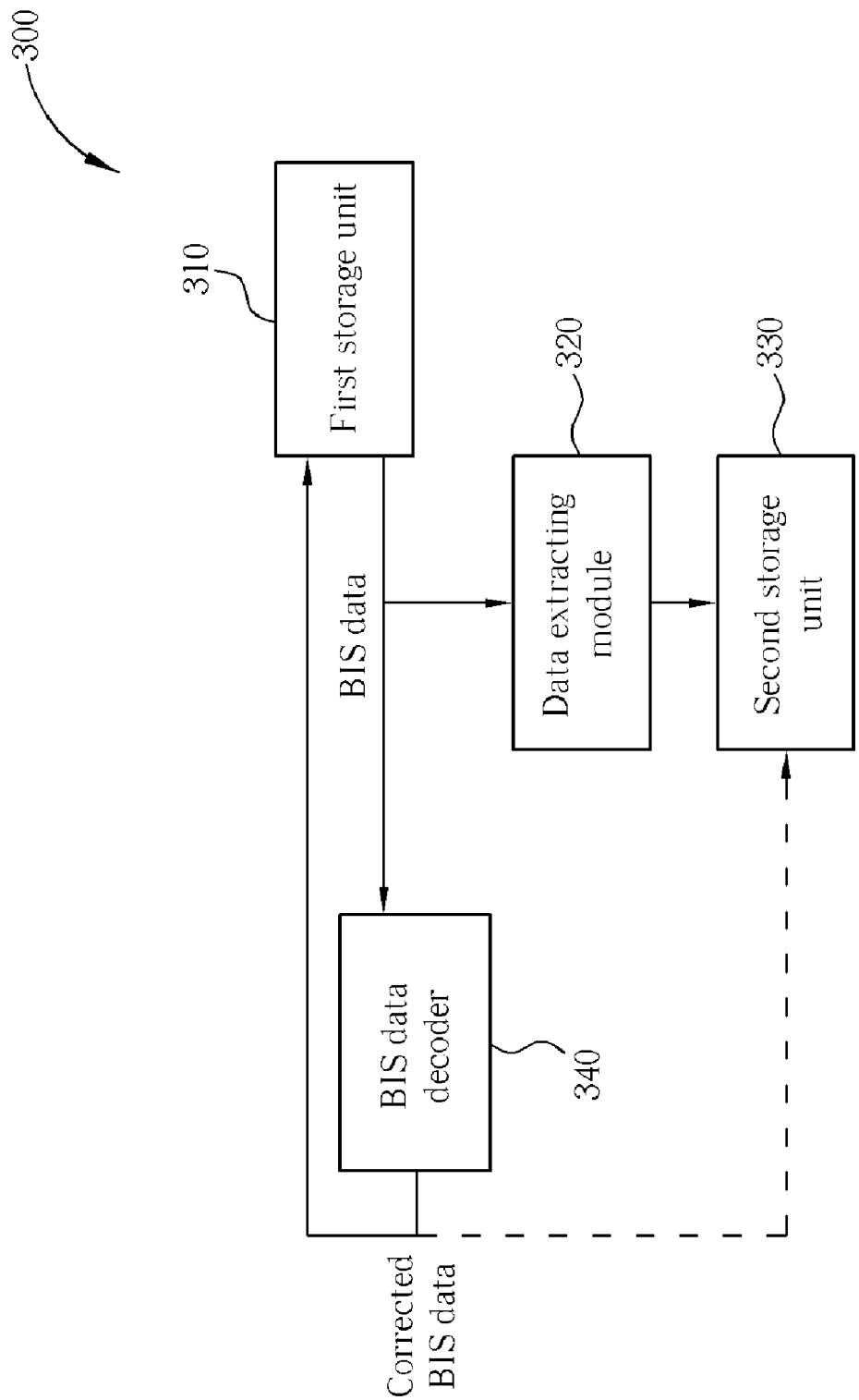
FIG. 3 is a functional block diagram of a data extracting device according to a first embodiment.
Figure 4:
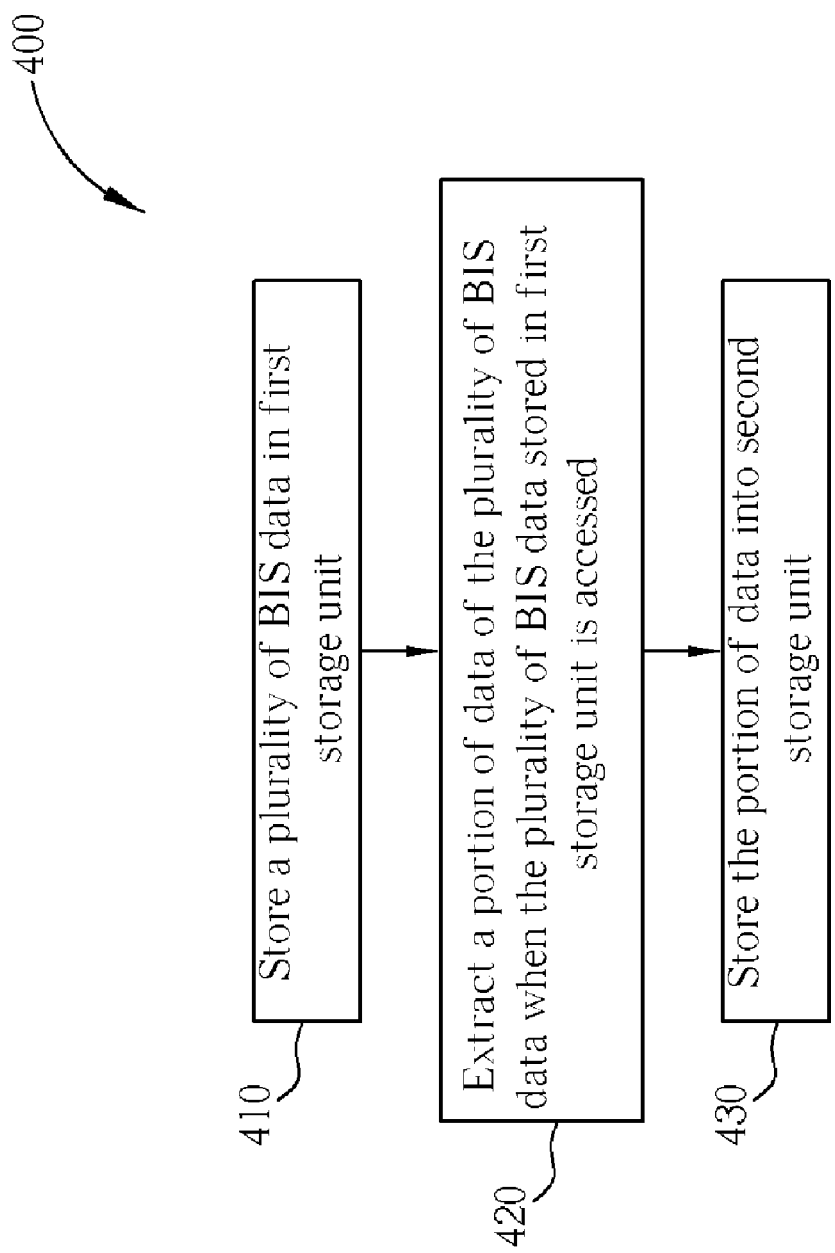
FIG. 4 is a flowchart illustrating a data extracting method according to a first embodiment.

Please refer to FIG. 3 and FIG. 4. FIG. 3 shows a functional block diagram of a data extracting device 300 according to a first embodiment. As shown in FIG. 3, the data extracting device 300 comprises a first storage unit 310, a data extracting module 320 coupled to the first storage unit 310, and a second storage unit 330 coupled to the data extracting module 320. In one embodiment, the first storage unit 310 and the second storage unit 330 are separate storage media. For example, the first storage unit 310 may be a memory and the second storage unit 330 may be a memory, a buffer, or a register module. In another embodiment, the first storage unit 310 and the second storage unit 330 are different memory sections of a same memory. FIG. 4 shows a flowchart 400 illustrating a data extracting method according to a first embodiment. Hereinafter, the operations of the data extracting device 300 will be explained with reference to the flowchart 400.

In step 410, the first storage unit 310 receives and stores a plurality of BIS (burst indicator subcode) data. In general, the plurality of BIS data is transmitted to the first storage unit 310 via a BIS buffer controller (not shown) of an optical storage device. In this embodiment, the plurality of BIS data may be the BIS block 100 mentioned previously or a BIS cluster. In other words, the proposed data extracting method can be applied to the plurality of BIS data regardless of weather the plurality of BIS data has been de-interleaved or not de-interleaved.

In step 420, the data extracting module 320 extracts a portion of data, such as some address fields or flag bits, of the plurality of BIS data when the plurality of BIS data stored in the first storage unit 310 is accessed by other components. For example, in the optical storage device, a BIS data decoder 340 is typically arranged for correcting errors of the plurality of BIS data stored in the first storage unit 310. The data extracting module 320 of this embodiment extracts the portion data of the plurality of BIS data when the BIS data decoder 340 accesses the plurality of BIS data stored in the first storage unit 310. The data extracting module 320 can extract the portion data of the plurality of BIS data from data being accessed by the BIS data decoder 340 and then output the extracted data.

In practical applications, the data extracting module 320 can be designed to extract partial data of at least one address field (e.g., an address unit number (AUN) of one address field or address unit numbers of a plurality of address fields), or partial flag bits of a plurality of address fields. The data extracting module 320 can also be designed to extract all flag bits of the plurality of address fields. Since locations of the specific data to be extracted by the data extracting module 320 are known, the data extracting module 320 can utilize counters (not shown) to count the row number, the column number, and even the bit number of BIS data read from the first storage unit 310 by the BIS data decoder 340. Once the row number, the column number, and even the bit number of a BIS data outputted from the first storage unit 310 match predetermined count values, the data extracting module 320 outputs the matched BIS data and stores the matched BIS data into the second storage unit 330 in step 430.

By this way, the data extracting module 320 can extract a portion BIS data with specific usage while the BIS data decoder 340 correcting the plurality of BIS data stored in the first storage unit 310 and store the portion of data into the second storage unit 330 for use in the following operations. As a result, the reading efficiency of the portion of data can be significantly improved thereby increasing the accessing speed for the blu-ray disc.

In practice, the data extracting module 320 may store the extracted portion of data in contiguous positions within the second storage unit 330, or the data extracting module 320 may store the extracted portion of data into the second storage unit 330 in which the portion of data are sorted by type in order to increase the accessing efficiency of the portion of data. For example, the four bytes corresponding to a same AUN can be stored in contiguous positions of the second storage unit 330, and flag bits of different types can be separately stored by type. In a preferred embodiment, when the portion of data stored in the second storage unit 330 contains errors, the data extracting device 300 can utilize the BIS data decoder 340 to update the portion of data stored in the second storage unit 330 with corrected BIS data.

Note that the extraction operations of the specific bits or bytes made by the data extracting module 320 not only can be performed while the BIS data decoder 340 is accessing the first storage unit 310 but can also be performed while other components are accessing the plurality of BIS data stored in the first storage unit 310. For example, the data extracting module 320 may extract the specific data from data being accessed by a de-interleaving unit when the de-interleaving unit performs a de-interleaving operation on a BIS cluster stored in a memory.

Figure 5:
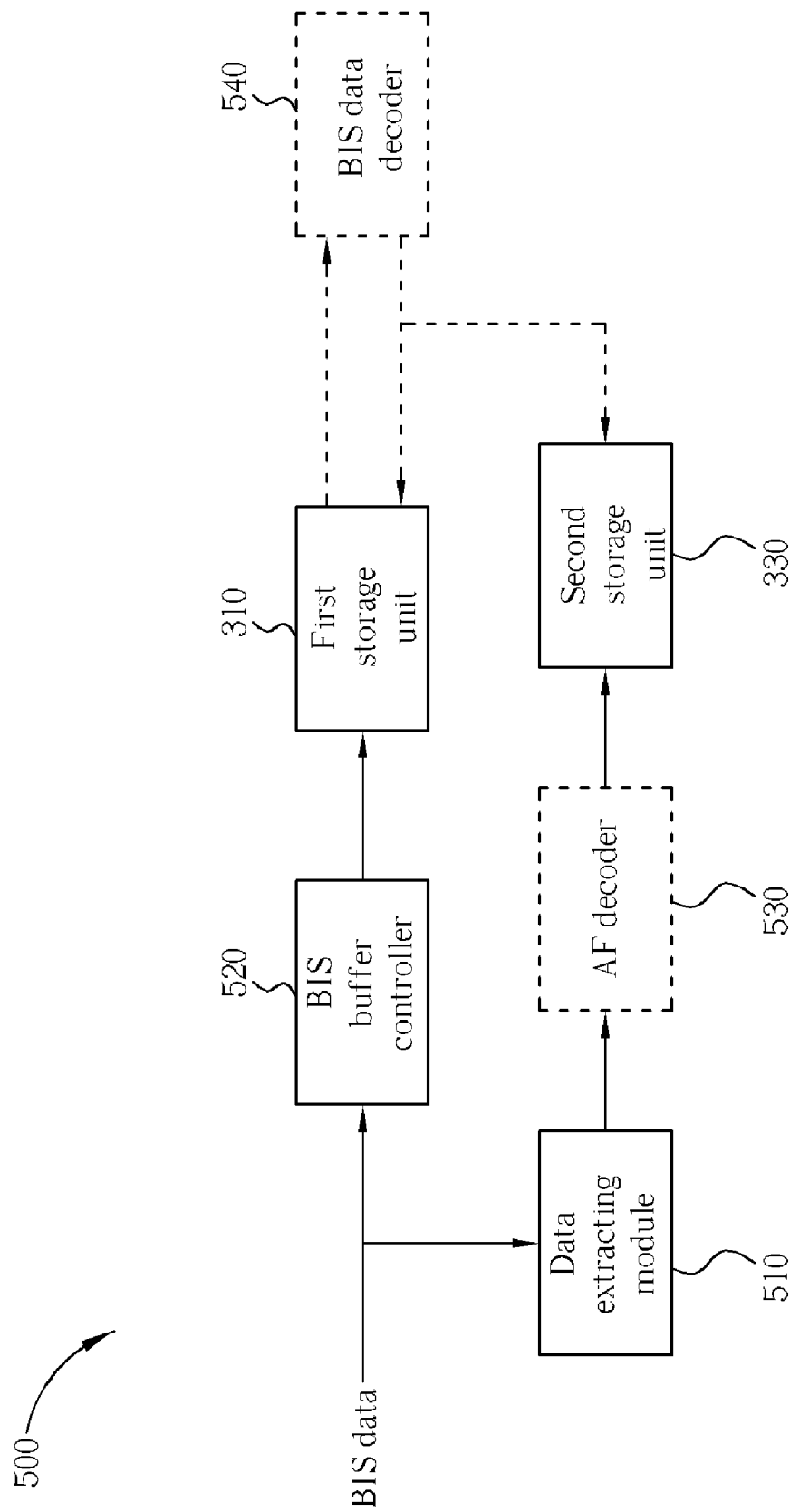
FIG. 5 is a functional block diagram of a data extracting device according to a second embodiment.
Figure 6:
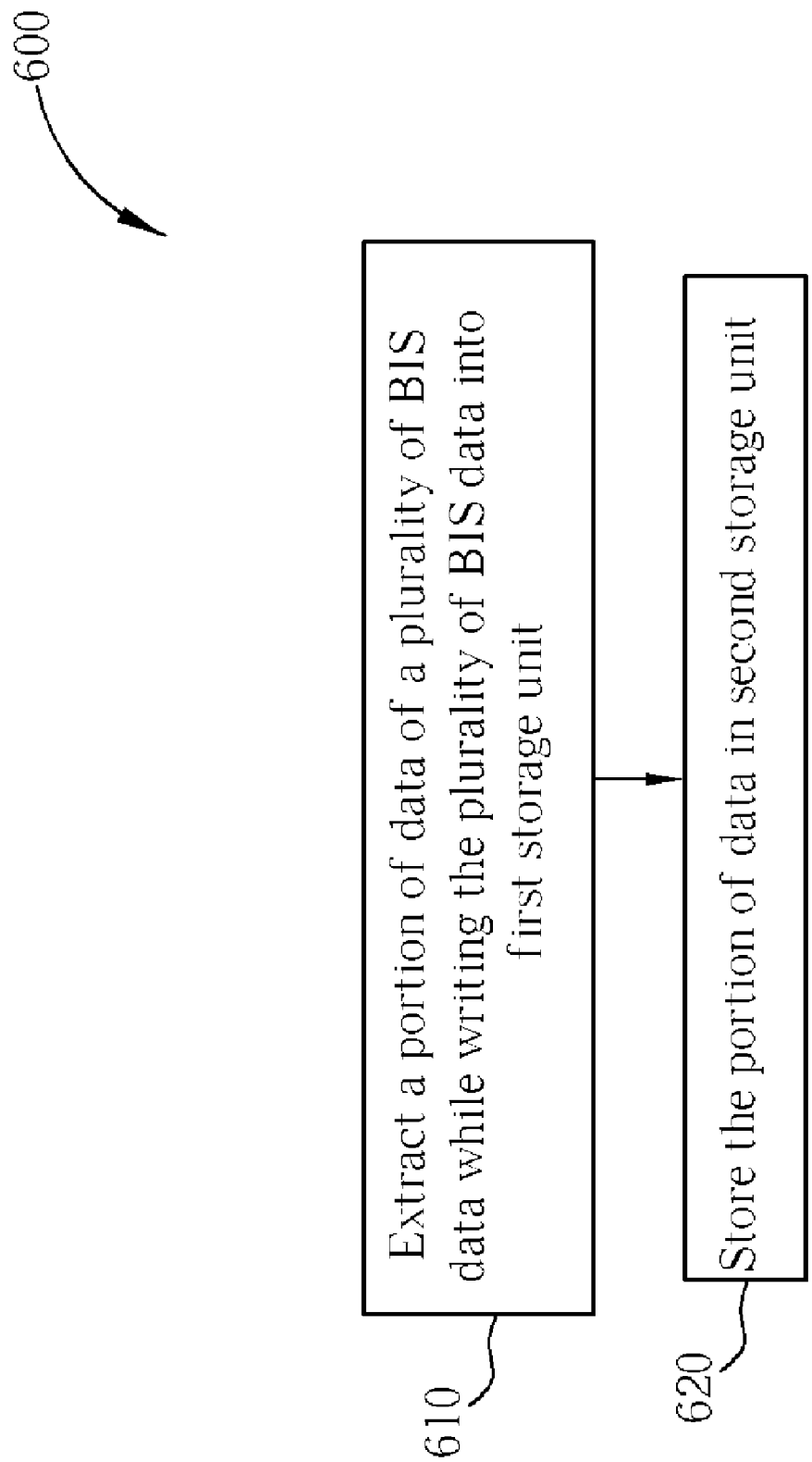
FIG. 6 is a flowchart illustrating a data extracting method according to a second embodiment.

Please refer to FIG. 5, which shows a functional block diagram of a data extracting device 500 according to a second embodiment. In this embodiment, the data extracting device 500 comprises a data extracting module 510 and a second storage unit 330. FIG. 6 is a flowchart 600 illustrating a data extracting method according to a second embodiment. Hereinafter, the operations of the data extracting device 500 will be explained with reference to the flowchart 600.

In step 610, the data extracting device 500 utilizes the data extracting module 510 to extract a portion of data of a plurality of BIS data while a BIS buffer controller 520 is writing the plurality of BIS data into a first storage unit 310. In practice, the data extracting module 510 can utilize counters (not shown) to count the row number, the column number, and even the bit number of a BIS data from a BIS block or a BIS cluster that is inputting into the BIS buffer controller 520. The data extracting module 510 can determine whether or not to extract the BIS data according to the counting results. The operations of the data extracting module 510 are substantially the same as the data extracting module 320. The difference between the data extracting module 510 and the data extracting module 320 is that the sources of BIS data are different. The data extracting module 320 of the previous embodiment extracts specific bits or bytes from BIS data output from the first storage unit 310 but the data extracting module 510 of this embodiment extracts those specific data while the plurality of BIS data is written into the first storage unit 310.

Subsequently, in step 620, the data extracting module 510 stores the extracted data in the second storage unit 330. Similar to the foregoing embodiments, the first storage unit 310 and the second storage unit 330 may be separate storage media or different sections of a memory.

In a preferred embodiment, the data extracting device 500 further comprises an address field decoder 530 (hereafter referred to as an AF decoder) coupled to and disposed between the data extracting module 510 and the second storage unit 330. The AF decoder 530 is arranged for correcting errors in an address field extracted by the data extracting module 510 to in an effort to increase the correctness of the data stored in the second storage unit 330. As in the foregoing descriptions, each address field contains nine bytes: four AUN bytes, one flag byte, and four parity bytes. The AF decoder 530 may correct errors within the four AUN bytes and the flag byte according to the four parity bytes. The operations of the AF decoder 530 are well known in the art, and further details are therefore omitted for brevity.

As mentioned previously, a BIS data decoder 540 is typically employed in the optical storage device to correct errors of the plurality of BIS data stored in the first storage unit 310. The data extracting device 500 of this embodiment can utilize the BIS data decoder 540 to update the BIS data stored in the second storage unit 330 while correcting the BIS data in the first storage unit 310.

Figure 7:
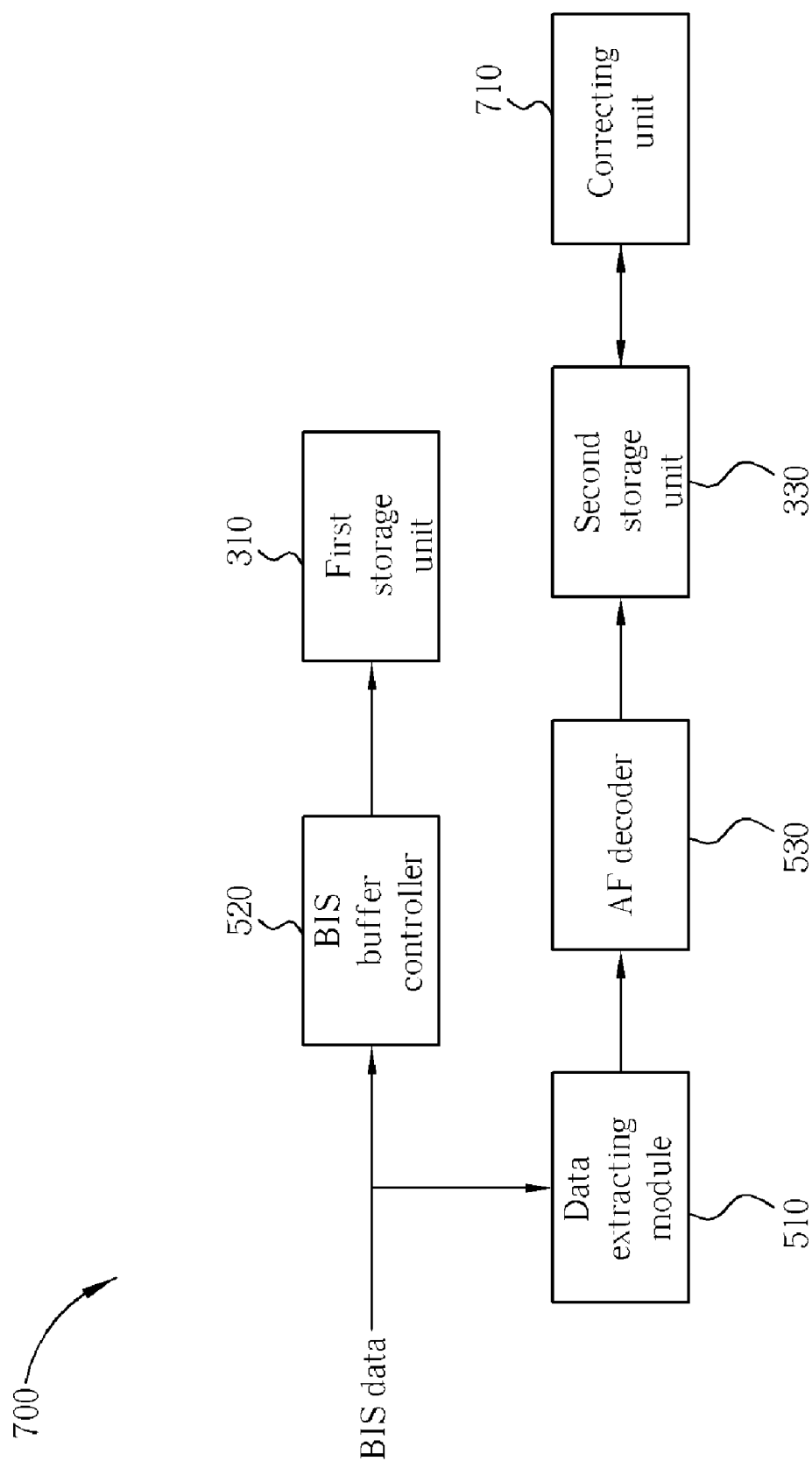
FIG. 7 is a functional block diagram of a data extracting device according to a third embodiment.

Please refer to FIG. 7, which shows a functional block diagram of a data extracting device 700 according to a third embodiment. The data extracting device 700 comprises a data extracting module 510, an AF decoder 530, a second storage unit 330, and a correcting unit 710 coupled to the second storage unit 330. The operations and implementations of the data extracting module 510, the AF decoder 530, and the second storage unit 330 are substantially the same as the foregoing embodiments and repeated descriptions are therefore omitted here.

In this embodiment, the correcting unit 710 corrects errors of AUNs of a plurality of address fields stored in the second storage unit 330 by employing a majority vote. Specifically, the difference between AUNs of different physical sectors is limited. In general, the difference between AUNs is typically occurred in the least significant bits. Accordingly, the correcting unit 710 can compare the most significant bits of the AUNs stored in the second storage unit 330 to identify errors within the AUNs. For example, suppose that there are sixteen AUNs stored in the second storage unit 330 in which the most significant bits of fifteen AUNs therein are "1111" while the most significant bits of the rest AUN is "1011". In this case, the correcting unit 710 can determine that the second most significant bit "0" of the rest AUN is wrong by employing a majority vote and correct it by switching it into a "1". It can be appreciated that the cooperation of the correcting unit 710 and the AF decoder 530 can further improve the correctness of data stored in the second storage unit 330.

Certain terms are used throughout the description and following claims to refer to particular system components. As one skilled in the art will appreciate, consumer electronic equipment manufacturers may refer to a component by different names. This document does not intend to distinguish between components that differ in name but not function. In the following discussion and in the claims, the terms "comprising" are used in an open-ended fashion, and thus should be interpreted to mean "comprising, but not limited to . . . ". Also, the term "couple" is intended to mean either an indirect or direct electrical connection. Thus, if a first device is coupled to a second device, that connection may be through a direct electrical connection, or through an indirect electrical connection via other devices and connections.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data extracting device comprising:
a first storage unit for storing a plurality of burst indicator subcode (BIS) data;
a data extracting module coupled to the first storage unit for extracting and outputting a portion of data of the plurality of BIS data when the plurality of BIS data is accessed;
a BIS data decoder coupled to the first storage unit for correcting errors of the plurality of BIS data stored in the first storage unit, wherein the data extracting module extracts the portion of data of the plurality of BIS data when the BIS data decoder accesses the plurality of BIS data stored in the first storage unit; and
a second storage unit coupled to the data extracting module for storing the portion of data transmitted from the data extracting module.

2. The data extracting device of claim 1, wherein the portion of data comprises partial data of at least one address field (AF).

3. The data extracting device of claim 2, wherein the data extracting module extracts and outputs an address unit number (AUN) of the address field.

4. The data extracting device of claim 2, wherein the data extracting module extracts and outputs address unit numbers (AUNs) of a plurality of address fields.

5. The data extracting device of claim 1, wherein the BIS data decoder updates the portion of data stored in the second storage unit with corrected data.

6. The data extracting device of claim 1, wherein the data extracting module stores the extracted data in contiguous positions within the second storage unit.

7. The data extracting device of claim 1, wherein the first and second storage units are different memory sections of a memory.

8. The data extracting device of claim 1, wherein the plurality of BIS data is a BIS block or a BIS cluster.

9. The data extracting device of claim 1, wherein the portion of data comprises at least partial flag bits of a plurality of address fields.

10. The data extracting device of claim 9, wherein the data extracting module extracts and outputs all flag bits of the plurality of address fields.

11. The data extracting device of claim 9, wherein the data extracting module stores the extracted flag bits into the second storage unit in which the flag bits are sorted by type.

12. A data extracting method comprising:
(a) storing a plurality of burst indicator subcode (BIS) data in a first storage unit;
(b) extracting a portion of data of the plurality of BIS data when the plurality of BIS data stored in the first storage unit is accessed;
(c) storing the portion of data in a second storage unit; and
(d) performing a BIS error correction operation to correct errors of the plurality of BIS data stored in the first storage unit, wherein when the BIS error correction operation accesses the plurality of BIS data stored in the first storage unit, extracting the portion of data from data being accessed by the BIS error correction operation.

13. The data extracting method of claim 12, wherein the portion of data comprises partial data of at least one address field (AF).

14. The data extracting method of claim 13, wherein the portion of data comprises an address unit number (AUN) of the address field.

15. The data extracting method of claim 13, wherein the portion of data comprises address unit numbers (AUNs) of a plurality of address fields.

16. The data extracting method of claim 12, wherein further comprising:
(d1) updating the portion of data stored in the second storage unit with corrected data.

17. The data extracting method of claim 12, wherein step (c) further comprises:
storing the portion of data in contiguous positions within the second storage unit.

18. The data extracting method of claim 12, wherein the first and second storage units are different memory sections of a memory.

19. The data extracting method of claim 12, wherein the plurality of BIS data is a BIS block or a BIS cluster.

20. The data extracting method of claim 12, wherein the portion of data comprises at least partial flag bits of a plurality of address fields.

21. The data extracting method of claim 20, wherein the portion of data comprises all flag bits of the plurality of address fields.

22. The data extracting method of claim 20, wherein step (c) further comprises:
storing the flag bits of the portion of data into the second storage unit in which the flag bits are sorted by type.

23. A data extracting device comprising:
a data extracting module for extracting and outputting a portion of data of a plurality of BIS data while the plurality of BIS data is written into a first storage unit;
a second storage unit coupled to the data extracting module for storing the portion of data transmitted from the data extracting module; and
a BIS data decoder coupled to the second storage unit for correcting errors of the plurality of BIS data and updating the portion of data stored in the second storage unit with corrected data.

24. The data extracting device of claim 23, wherein the portion of data comprises partial data of at least one address field (AF).

25. The data extracting device of claim 24, wherein the data extracting module extracts and outputs an address unit number (AUN) of the address field.

26. The data extracting device of claim 24, wherein the data extracting module extracts and outputs address unit numbers (AUNs) of a plurality of address fields.

27. The data extracting device of claim 26, further comprising:
a correcting unit coupled to the second storage unit for correcting errors of the address unit numbers of the plurality of address fields by employing a majority vote.

28. The data extracting device of claim 24, wherein the data extracting module extracts and outputs all bytes of the address field.

29. The data extracting device of claim 28, further comprising:
an address field decoder (AF decoder) coupled to and disposed between the data extracting module and the second storage unit, for correcting errors of the address field.

30. The data extracting device of claim 23, wherein the data extracting module stores the extracted data in contiguous positions within the second storage unit.

31. The data extracting device of claim 23, wherein the first and second storage units are different memory sections of a memory.

32. The data extracting device of claim 23, wherein the plurality of BIS data is a BIS block or a BIS cluster.

33. The data extracting device of claim 23, wherein the portion of data comprises at least partial flag bits of a plurality of address fields.

34. The data extracting device of claim 33, wherein the data extracting module extracts and outputs all flag bits of the plurality of address fields.

35. The data extracting device of claim 33, wherein the data extracting module stores the extracted flag bits into the second storage unit in which the flag bits are sorted by type.

36. A data extracting method comprising:
extracting a portion of data of a plurality of BIS data while the plurality of BIS data is written into a first storage unit;
storing the portion of data in a second storage unit; and
performing a BIS error correction operation to correct errors of the plurality of BIS data and updating the portion of data stored in the second storage unit with corrected data.

37. The data extracting method of claim 36, wherein the portion of data comprises partial data of at least one address field (AF).

38. The data extracting method of claim 37, wherein the portion of data comprises an address unit number (AUN) of the address field.

39. The data extracting method of claim 37, wherein the portion of data comprises address unit numbers (AUNs) of a plurality of address fields.

40. The data extracting method of claim 39, further comprising:
correcting errors of the address unit numbers of the plurality of address fields by employing a majority vote.

41. The data extracting method of claim 37, wherein the portion of data comprises all bytes of the address field.

42. The data extracting method of claim 41, further comprising:
correcting errors of the address field according to the parity of the address field.

43. The data extracting method of claim 36, wherein the step of storing the portion of data in a second storage unit further comprises:
storing the portion of data in contiguous positions within the second storage unit.

44. The data extracting method of claim 36, wherein the first and second storage units are different memory sections of a memory.

45. The data extracting method of claim 36, wherein the plurality of BIS data is a BIS block or a BIS cluster.

46. The data extracting method of claim 36, wherein the portion of data comprises at least partial flag bits of a plurality of address fields.

47. The data extracting method of claim 46, wherein the portion of data comprises all flag bits of the plurality of address fields.

48. The data extracting method of claim 46, wherein the step of storing the portion of data in a second storage unit further comprises:
storing the flag bits of the portion of data into the second storage unit in which the flag bits are sorted by type.

* * * * *